US006915398B2

(12) United States Patent  
Matsubara et al.

(10) Patent No.: US 6,915,398 B2
(45) Date of Patent: Jul. 5, 2005

(54) DATA REPRODUCTION SYSTEM, DATA RECORDER AND DATA READER PREVENTING FRAUDULENT USAGE BY MONITORING REPRODUCIBLE TIME LIMIT

(75) Inventors: Takanobu Matsubara, Nara (JP); Goh Matsubara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 498 days.

(21) Appl. No.: 10/001,813

(22) Filed: Dec. 5, 2001

(65) Prior Publication Data

US 2002/0083284 A1 Jun. 27, 2002

(30) Foreign Application Priority Data

Dec. 26, 2000 (JP) ........................................ 2000-394102
Apr. 26, 2001 (JP) ........................................ 2001-129378

(51) Int. Cl.[7] .............................................. G06F 12/00
(52) U.S. Cl. ...................... 711/163; 711/164; 711/167; 711/112; 386/94; 386/95; 386/111; 386/124
(58) Field of Search ................................ 711/112, 163, 711/164, 167; 386/94, 95, 111, 124

(56) References Cited

U.S. PATENT DOCUMENTS

| 5,856,958 A | * | 1/1999 | Yokota et al. ......... 369/124.09 |
| 5,903,705 A | * | 5/1999 | Yonemitsu et al. ........... 386/95 |
| 5,905,797 A |   | 5/1999 | McRae |
| 6,377,744 B1 | * | 4/2002 | Wakui ......................... 386/46 |
| 6,504,997 B1 | * | 1/2003 | Park et al. .................. 386/125 |
| RE38,007 E | * | 2/2003 | Tsukamoto et al. ......... 380/203 |
| 2001/0019302 A1 |   | 9/2001 | Yatsu et al. |
| 2002/0064096 A1 | * | 5/2002 | Ukita et al. ................... 368/66 |

FOREIGN PATENT DOCUMENTS

| EP | 0 740 478 A2 | 10/1996 |
| EP | 0 813 194 A2 | 12/1997 |
| EP | 0 851 418 A2 | 7/1998 |
| EP | 0 878 796 A2 | 11/1998 |
| EP | 1 058 257 A1 | 12/2000 |
| EP | 1 069 564 A2 | 1/2001 |
| JP | 02-083732 | 3/1990 |
| JP | 4-137838 | 5/1992 |
| JP | 8-235402 | 9/1996 |
| JP | 10-269144 | 10/1998 |
| JP | 02003196895 | * 12/2001 |

* cited by examiner

Primary Examiner—Donald Sparks
Assistant Examiner—Ngoc V Dinh
(74) Attorney, Agent, or Firm—Nixon & Vanderhye P.C.

(57) ABSTRACT

A data reader includes: a memory card interface communicating with a memory card in which is recorded data such as video, the recorded date of that data, and a reproduction time limit of that data; a real time clock detecting the current date; a display unit reading out data from the memory card to display video or the like; and a CPU comparing the current date detected by the real time clock with the recorded date and reproduction time limit of the data recorded in the memory card to determine whether reproduction of the data recorded in the memory card is allowed or not.

40 Claims, 11 Drawing Sheets

DATA REPRODUCTION SYSTEM, DATA RECORDER AND DATA READER PREVENTING FRAUDULENT USAGE BY MONITORING REPRODUCIBLE TIME LIMIT

BACKGROUND OF THE INVENTION

1. Field of the Invention

The present invention relates to the technique of reproducing digital data only during a term that allows reproduction, particularly to the technique of detecting fraudulent modification of the current time in a reproduction apparatus including a circuit that detects the current time to strictly monitor reproduction of digital data.

2. Description of the Background Art

In accordance with the development of recent digital technology, image data and music data recorded on a recording medium in a digital form can be reproduced at the user side using a reproduction apparatus. In the case where the recording medium is available on a rental basis, the user can reproduce the video and music using a reproduction apparatus if within a preset reproduction term. Here, determination of whether reproduction is allowed or not is made based on the detected time at the user's reproduction apparatus and the reproduction time limit information recorded in the recording medium. If the current time detected by the user's reproduction apparatus is improperly modified, the content can be reproduced even if the reproduction time limit has expired. Monitoring the time detect by the user's reproduction apparatus is a critical factor.

Japanese Patent Laying-Open No. 8-235402 discloses a time recorder detecting any fraudulent modification of time. The time recorder disclosed in this publication monitors time based on the time of an internal clock. The time recorder includes a first detection circuit detecting time at high accuracy, a second detection circuit detecting time at lower accuracy than the first detection circuit, a circuit storing in-and-out time data representing the arrival and departure time based on the time detected by the second detection circuit, a calculation circuit calculating the time difference between the first detection circuit and the second detection circuit every time the in-and-out time data is input, a determination circuit determining whether the absolute value of the calculated time difference exceeds a reference time, and a circuit recording the modification history when the time difference exceeds the reference time.

The first detection circuit has the time set only by an administrator. The second detection circuit is adjusted to the time detected by the first detection circuit, when there is error in time, by an individual other than the administrator. The time recorder includes two detection circuits to detect the time, and determines whether the time is modified or not based on the calculation of the time difference obtained according to the time detected by the first detection circuit of higher detection accuracy. Accordingly, the history of the time being modified improperly is recorded when the time difference calculated by the calculation circuit exceeds a reference time.

It is to be noted that this time recorder requires a first detection circuit that detects time at high accuracy, which is expensive. Although the time can be monitored strictly in a reproduction circuit reproducing digital data, the usage of such a first detection circuit will increase the cost of the reproduction apparatus.

SUMMARY OF THE INVENTION

An object of the present invention is to provide a data reproduction system, a data recorder, and a data reader strictly monitoring the reproduction time limit to determine whether digital data output is allowed or not.

Another object of the present invention is to provide a data reproduction system, a data recorder and a data reader strictly monitoring the reproduction time limit with respect to fraudulent usage by a user of a reproduction apparatus to determine whether digital data output is allowed or not.

A further object of the present invention is to provide a data reproduction system, a data recorder and a data reader detecting fraudulent operation of the time by the user of a reproduction apparatus.

Still another object of the present invention is to provide an economical data reproduction system, a data recorder and a data reader strictly monitoring the reproduction time limit to determine whether digital data output is allowed or not.

A still further object of the present invention is to provide a data reproduction system, a data recorder and a data reader detecting the current time based on the reproduced time of digital data using the data reader.

According to an aspect of the present invention, a data reproduction system reads, using a data reader, data written in a recording medium using a data recorder. The data recorder includes a storage circuit storing data, a detection circuit detecting the date, a set circuit setting the time limit of allowing data output using the data reader, and a record circuit connected to the storage circuit, the detection circuit and the set circuit to record into a recording medium the data stored in the storage circuit, the time limit set by the set circuit, and the recorded date of the data and time limit detected by the detection circuit. The data reader includes a detection circuit detecting the date, a read circuit reading out the time limit and recorded date from the recording medium, a determination circuit connected to the detection circuit and read circuit of the data reader to determine whether output of the data recorded in the recording medium is allowed or not based on the time limit and recorded date read out by the read circuit and the current date detected by the detection circuit, and an output circuit connected to the determination circuit to read out data from the recording medium for output when data output is allowed.

The data recorder sets the time limit that allows data output using the data reader to record to the recording medium data, time limit, and date of recording the data and time limit to the recording medium. The data reader determines whether output of the data recorded in the recording medium is allowed or not based on the time limit and recorded date read out from the recording medium and the detected current date. Consider the case where the time limit allowing data output has elapsed and the user improperly modifies the current date that will be detected by the detection circuit of the data reader to a date before the recorded date to attempt improper data output. Since the improperly modified current date is before the recorded date of the data, the determination circuit determines that data output is not allowed. Thus, an inexpensive data reproduction system monitoring the reproduction time limit to output digital data can be provided.

Preferably, the data reader includes an overwrite circuit connected to the detection circuit of the data reader to overwrite the recorded date recorded in the recording medium with the current date detected by the detection circuit.

The recorded date in the recording medium is overwritten with the current date by the overwrite circuit. Consider the case where the time limit allowing data output has elapsed and the current date that will be detected by the detection circuit of the data reader has been modified improperly. Until the time limit allowing data output expires, the proper current date is detected and the proper current date is recorded in the recorded date region of the recording medium. After the time limit has elapsed, the user improperly modifies the current date that will be detected by the detection circuit to attempt improper data output. Since the current date is before the date when the data has been recorded (the date overwritten by the proper current date), the determination circuit determines that data output is not allowed.

Further preferably, the determination circuit includes a circuit that determines output of the data recorded in the recording medium is allowed if the current date is after the recorded date and before the time limit.

When the current date detected by the detection circuit of the data reader is not improperly modified and the current date is within the time limit where data output is allowed, determination is made that the data recorded in the recording medium can be output.

Further preferably, the detection circuit includes a circuit detecting the date of commencing data output, a circuit detecting the elapsed time from the date of commencing output, and a circuit detecting the current time based on the date of commencing output and the elapsed time.

Consider the case where the current date detected by the detection circuit is modified improperly after commencing data output. The current time detected by the detection circuit of the data reader is calculated by adding the elapsed time from the date of commencing output to the date of commencing data output. Accordingly, the proper current time can be calculated even if a user improperly modifies the current time after commencing data output.

Further preferably, the data reader includes an incorrect date detection circuit detecting that the current time is not correct when the current time is before the recorded date.

Detection is made that the current date is not correct by the incorrect date detection circuit. Improper modification of the current date in the data recorder by a user can be detected.

Further preferably, the data reader includes a processing circuit connected to the incorrect date detection circuit to disable data output from the recording medium when detection is made that the current time is not correct.

When detection is made that the current date is not correct, the processing circuit effects a process to disable data output from the recording medium. Accordingly, a fraudulent act by the user of the data reader will cause erasure or the like of the entire data recorded in the recording medium.

Further preferably, the data reader includes a monitor date storage circuit connected to the detection circuit of the data reader to store the date detected by the detection circuit of the data reader as the monitor date. The determination circuit includes a circuit determining whether output of data recorded in the recording medium is allowed or not based on the time limit, the recorded date, the monitor date, and the current date.

The data reader stores the monitor date. The monitor date is the date detected by the detection circuit of the data reader. The determination circuit determines that output of data recorded in the recording medium is allowed when the current date is, for example after the recorded date, after the monitor date, and before the time limit. Even if a user improperly modifies the current date to a date after the recorded date, before the monitor date, and before the time limit to attempt improper data output, the determination circuit determines that data output is not allowed since the current date is before the monitor date.

According to another aspect of the present invention, a data record method includes the steps of preparing data, detecting the date, setting a time limit allowing data output using a data reader, and recording into the recording medium the prepared data, the set time limit, and the recorded date of the data and time limit detected at the step of detecting the date.

According to the data record method, the time limit of data output using the data reader is set, and the data, the time limit, and the recorded date of the data and time limit to the recording medium are recorded in the recording medium. The data reader determines whether output of data recorded in the recording medium is allowed or not based on the time limit and recorded date read out from the recording medium and the detected current date. Consider the case where the time limit of data output has elapsed and a user improperly modifies the current date that will be detected by the data recorder to a date prior to the recorded date to attempt data output. The data reader determines that data output is not allowed since the current date improperly modified is before the date when data has been recorded.

According to a further aspect of the present invention, a data read method includes the steps of detecting the date, reading out the time limit and recorded date from a recording medium, determining whether output of data recorded in the recording medium is allowed or not based on the time limit and recorded date read out and the current date detected at the step of detecting the date, and reading out data from the recording medium for output when data output is allowed.

According to the data read method, the time limit and recorded date are read out from the recording medium recorded with data, the time limit, and the recorded date of the data and time limit in the recording medium. By the data read method, determination is made whether output of the data recorded in the recording medium is allowed or not based on the time limit and recorded date and the detected current time. Consider the case where the time limit of data output has elapsed and a user improperly modifies the current date that will be detected by the detection circuit of the data reader to a date before the recorded date. Since the current date improperly modified is before the date when data has been recorded, determination is made that data output is not allowed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
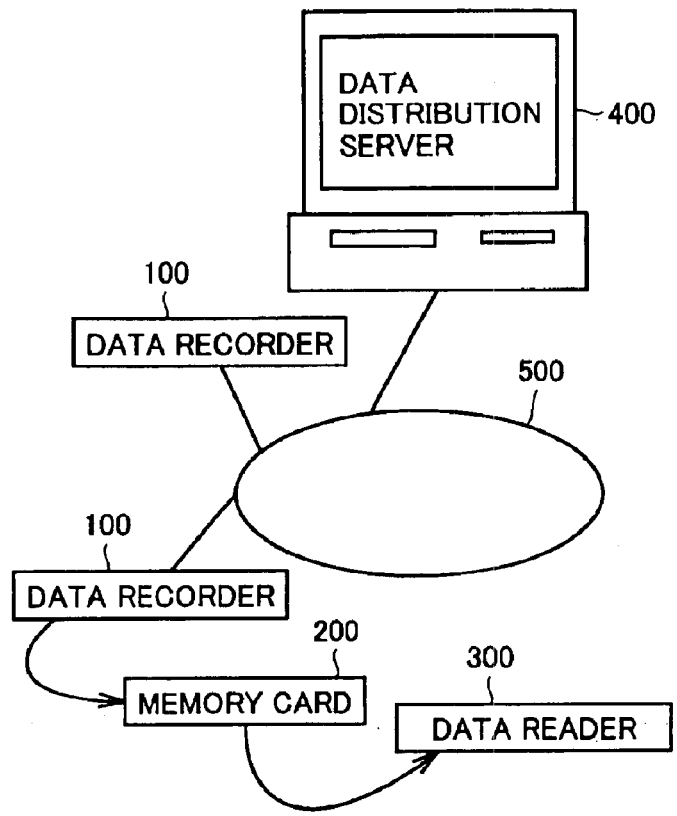
FIG. 1 shows an entire structure of a data reproduction system according to an embodiment of the present invention.

Embodiments of the present invention will be described hereinafter with reference to the drawings. In the following description, the same components have corresponding reference characters allotted. Their designations and functions are identical. Therefore, detailed description thereof will not be repeated, where appropriate.

First Embodiment

Referring to FIG. 1, a data reproduction system according to a first embodiment includes a data recorder 100 recording data into a memory card 200, a data reader 300 reading out data from memory card 200, a data distribution server 400 transmitting data to data recorder 100, and a network 500 connecting data recorder 100 and data distribution server 400.

Data recorder 100 temporarily stores data representing images, video and music received from data distribution server 400. Data recorder 100 records the temporarily stored data into memory card 200 in response to a user's request. Data recorder 100 is installed at a site where many people gather such as a terminal building or a convenience store.

Data reader 300 is installed at the home of a user, for example. Data reader 300 reads out data recorded in memory card 200 using data recorder 100. Data reader 300 outputs an image, video and music based on the data read out from memory card 200.

Memory card 200 is a recording medium that can be carried by a user. For example, memory card 200 is a recording medium in the form of a card employing a semiconductor memory.

Data distribution server 400 stores data representing an image, video and music. Data distribution server 400 distributes these data to a plurality of data recorders 100 via network 500.

Figure 2:
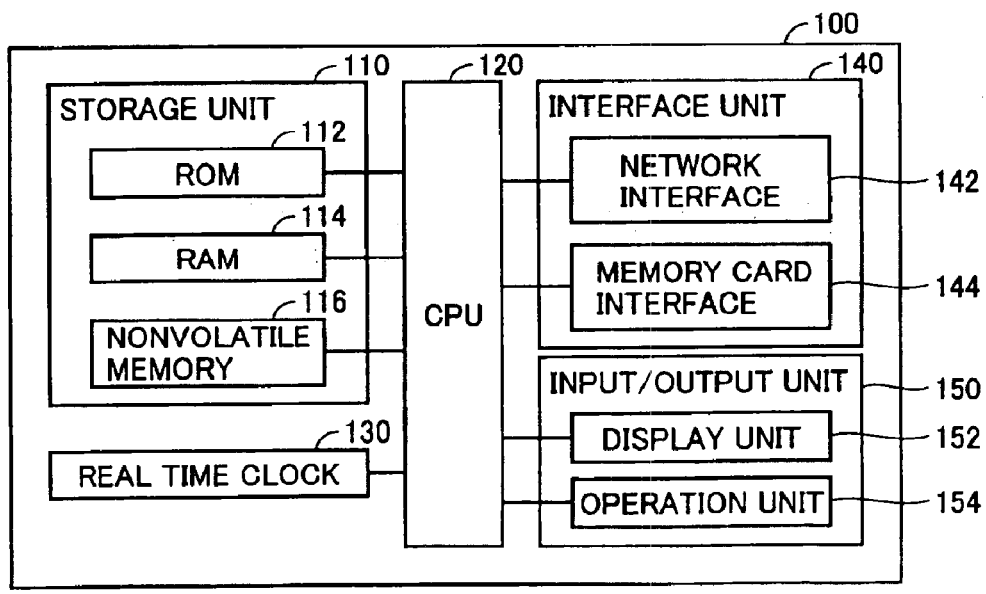
FIG. 2 is a control block diagram of a data recorder.

The structure of data recorder 100 of the present embodiment will be described with reference to FIG. 2. Referring to FIG. 2, data recorder 100 includes a storage unit 110 to store various data, a real time clock 130 detecting the current date, an interface unit 140 to communicate with an external apparatus, an input/output unit 150 to input a user's operation and to output data, and a CPU (Central Processing Unit) 120 connected to storage unit 110, real time clock 130, interface unit 140 and input/output unit 150 to control data recorder 100.

Storage unit 110 includes a ROM (Read Only Memory) 112 storing a program to control data recorder 100, a secret key used to decode the encryption of digital data, and the like, a RAM (Random Access Memory) 114 to store data during execution of the program, and a nonvolatile memory 116 storing data representing the image, video and music received from data distribution server 400. A plurality of secret keys are stored in ROM 112. The relationship between a secret key and a user ID (Identification) is stored in RAM 114. The user ID is information adopted by data recorder 100 to identify a user in the data reproduction system.

Interface unit 140 includes a network interface 142 to receive data from data distribution server 400 connected on network 500, and a memory card interface 144 to be connected to memory card 200 to communicate therewith. Memory card 200 is attached to memory card interface 144. Memory card interface 144 is under control of CPU 120 to read out data from memory card 200 and record data into memory card 200.

Input/output unit 150 includes a display unit 152 displaying a list of data representing an image, video and music stored in nonvolatile memory 116 as well as an operation procedure, and an operation unit 154 for the operation of a user to select data to be recorded into memory card 200 from the list of data displayed on display unit 152. The user initializes a memory card according to the operation procedure displayed at display unit 150.

The structure of data reader 300 of the present embodiment will be described with reference to FIG. 3. Data reader 300 includes a memory card interface 344 instead of interface unit 140 of data recorder 100. Data reader 300 includes an audio output unit 356 in addition to the structure of input/output unit 150 of data recorder 100.

Memory card interface 344 is equivalent to memory card interface 144 described above. Audio output unit 356 provides audio output based on the digital data recorded in memory card 200.

Figure 3:
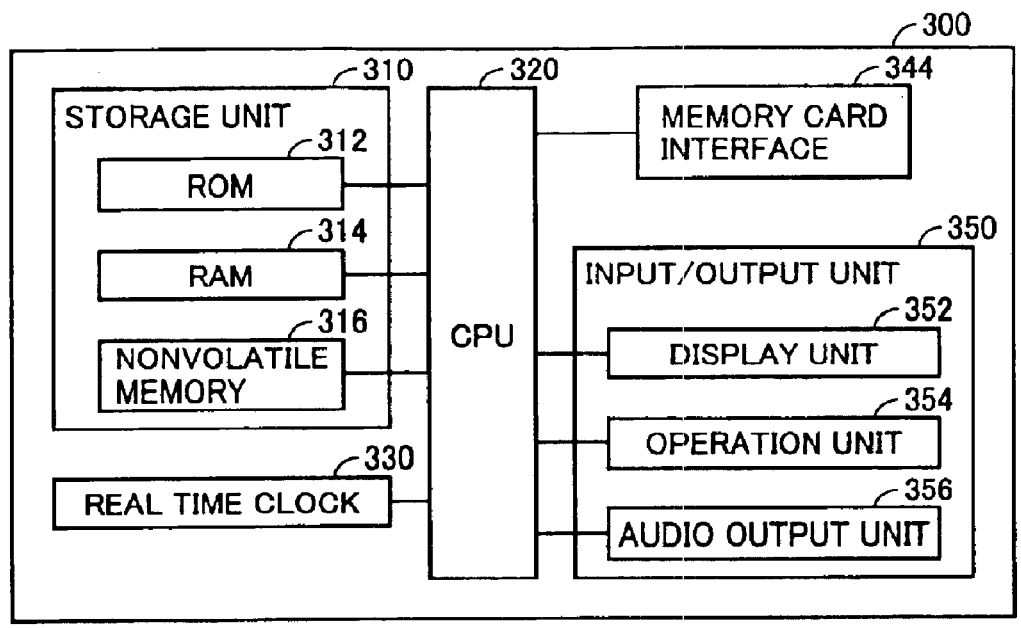
FIG. 3 is a control block diagram of a data reader.

ROM 112 and RAM 314 shown in FIGS. 2 and 3, respectively, store secret keys to decode encryption of digital data employed in the data reproduction system. A user ID and the relationship between a secret key and a user ID are stored in RAM 114 and RAM 314. The current date detected by real time clock 330 is stored in nonvolatile memory 316 of data reader 300. The current date stored in nonvolatile memory 316 is called "the latest time of reader".

Figure 4:
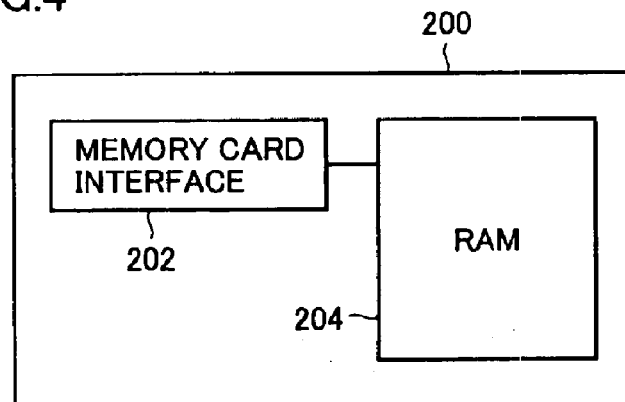
FIG. 4 is a control block diagram of a memory card.

The structure of memory card 200 will be described with reference to FIG. 4. Memory card 200 includes a memory card interface 202, and a RAM 204 connected to memory interface 202. Memory card interface 202 communicates with data recorder 100 or data reader 300 via memory card interface 114 or memory card interface 344, respectively.

Figure 5:
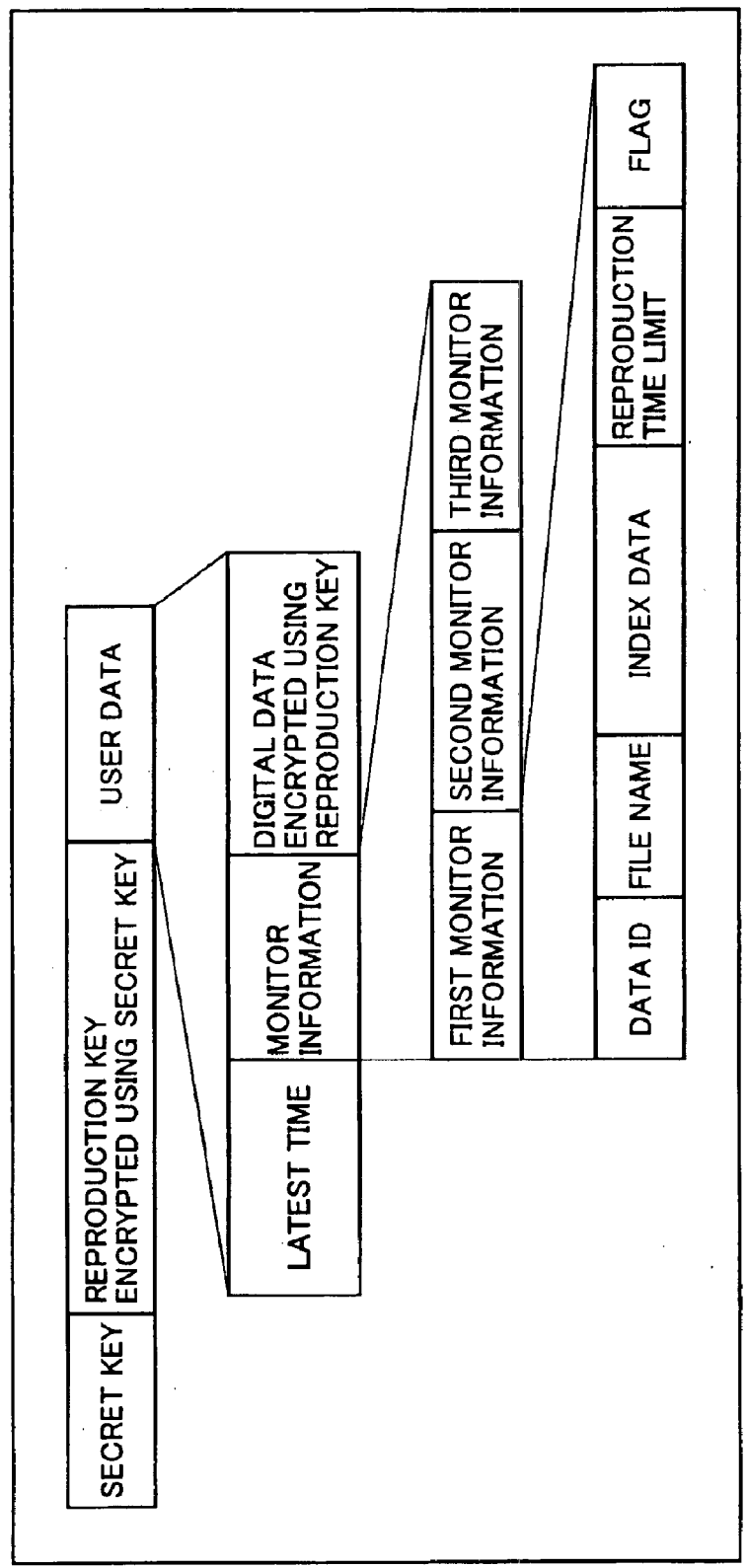
FIG. 5 shows data recorded in a memory card.

The data recorded in RAM 204 of memory card 200 of FIG. 4 will be described with reference to FIG. 5. The data recorded in RAM 204 includes a secret key, a reproduction key encrypted with the secret key, and user data. In the present data reproduction system, an encryption process according to the DES (Data Encryption Standard) is employed.

The user data includes the latest time, monitor information, and digital data encrypted using a reproduction key. The latest time corresponds to the current date detected by real time clock 330. The latest time recorded in memory card 200 is called "the latest time of memory card".

The monitor information includes information corresponding to the type of the recorded digital data. For example, consider the case where three types of digital data are recorded in memory card 200. In this case, three monitor information are recorded. The monitor information includes first monitor information, second monitor information and third monitor information. For example, the first monitor information includes a data ID to identify the first data under control of the first information, the file name of the first digital data, index data representing a general description of the first digital data, the reproduction time limit of the first digital data, and a flag. The flag serves to identify whether reproduction of respective digital data is allowed or not. Digital data cannot be reproduced if this flag is reset.

The secret key stored in ROM 112 of data recorder 100, RAM 314 of data reader 300 and RAM 204 of memory card 200 is set for each user of the present system. Memory card 200 of FIG. 4 can have data recorded only through data recorder 100 of the present data reproduction system, and can have data read out only through data reader 300 of the present data reproduction system.

Initialization of memory card 200 will be described here. For the purpose of mutual authentication of memory card 200 and data recorder 100, memory card 200 must be initialized.

A user sets a memory card 200 that is not yet initialized in data recorder 100. Data recorder 100 selects the user ID of the user of the data reproduction system. Data recorder 100 selects one secret key stored in ROM 112. Data recorder 100 records the relationship between the user ID and secret key in RAM 114. Data recorder 100 displays the user ID and secret key at display unit 132. The user notes the displayed user ID and secret key. Data recorder 100 records the secret key into RAM 204 of memory card 200. Digital data is recorded into memory card 200 subjected to such initialization.

Initialization of data reader 300 will be described here. For the purpose of mutual authentication between memory card 200 and data reader 300, data reader 300 must be initialized.

The user inputs the noted user ID and secret key to data reader 300. Data reader 300 stores the input user ID and secret key in RAM 314. Memory card 200 is set in data reader 300 initialized as described above to read out digital data.

Figure 6:
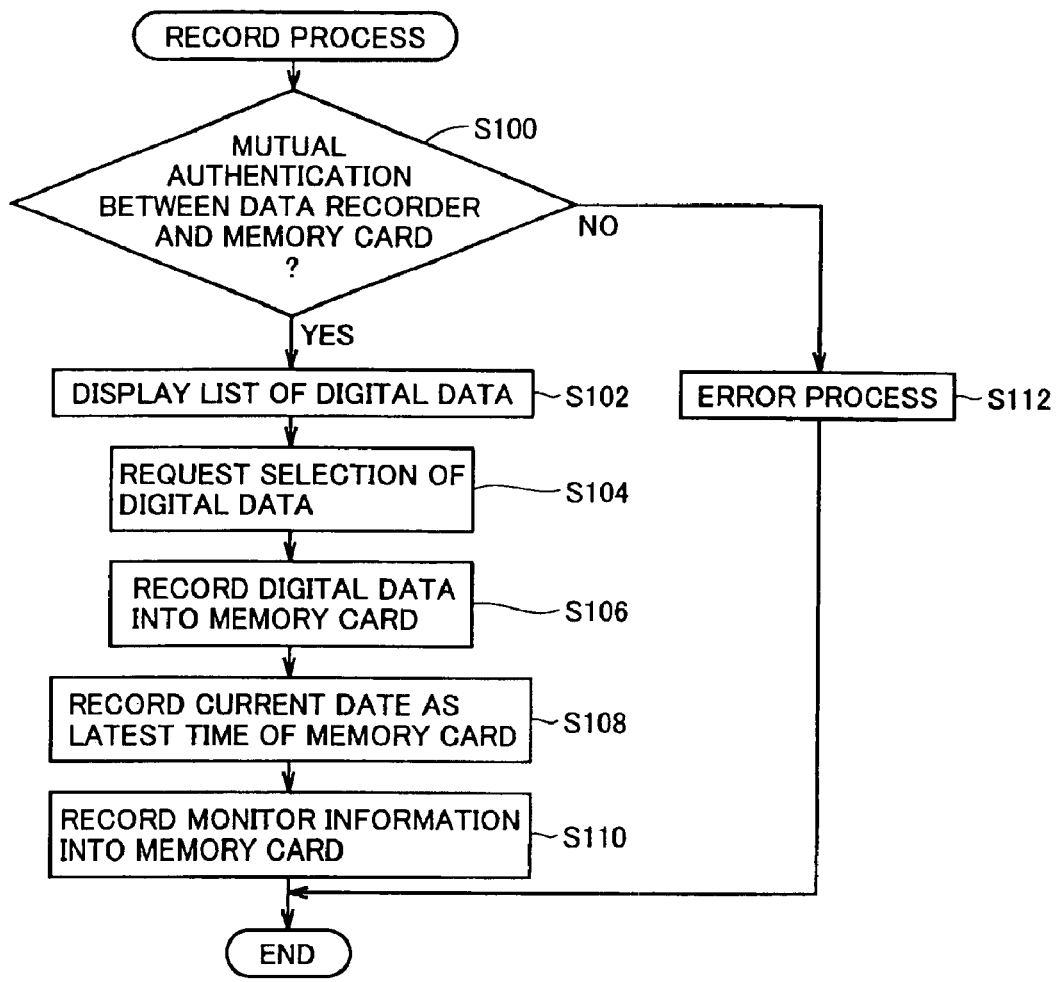
FIG. 6 is a flow chart of a control procedure of a recording process according to an embodiment of the present invention.

Referring to FIG. 6, the program executed by data recorder 100 has a control structure as set forth below as to a record process.

At step (abbreviated as "S" hereinafter) 100, CPU 120 of data recorder 100 determines whether mutual authentication with memory card 200 set in data recorder 100 has been performed or not. The user sets memory card 200 in memory card interface 144. The user inputs a user ID through operation unit 154 of data recorder 100. CPU 120 reads the secret key recorded in RAM 204 of memory card 200 via memory card interface 144. CPU 120 determines whether the secret key recorded in RAM 204 of memory card 200 matches the secret key stored in ROM 112 of data recorder 100, and whether the user ID stored in RAM 114 corresponding to the matching secret key matches the input user ID. Determination is made that mutual authentication is verified when the secret keys and user IDs respectively match each other. When mutual authentication between data recorder 100 and memory card 200 is verified (YES at S100), control proceeds to S102. If mutual authentication is not verified (NO at S100), control proceeds to S112. Mutual authentication between data recorder 100 and memory card 200 is denied when a memory card not corresponding to the present data reproduction system is used, when a memory card not initialized is used, and when a memory card of a proper user is used by an improper user.

At S102, CPU 120 displays at display unit 152 a list of digital data stored in data recorder 100 based on the index of digital data stored in nonvolatile memory 116.

At S104, CPU 120 requests the user to select digital data recorded in memory card 200. Here, a request to select digital data from the displayed list is provided on display unit 152.

At S106, CPU 120 reads the requested digital data from nonvolatile memory 116 to record the digital data into RAM 204 of memory card 200. Nonvolatile memory 116 is recorded with digital data that is encrypted using a reproduction key. Encrypted digital data is recorded in RAM 204 of memory card 200.

At S108, CPU 120 records the current date detected by real time clock 130 as "the latest time of memory card". At S110, CPU 120 records into memory card 200 monitor information corresponding to the digital data recorded in memory card 200.

At S112, CPU 120 carries out an error process when mutual authentication between data recorder 100 and memory card 200 is not verified. Here, CPU 120 provides a display indicating that mutual authentication is not allowed at display unit 152 as the error process.

Figure 7:
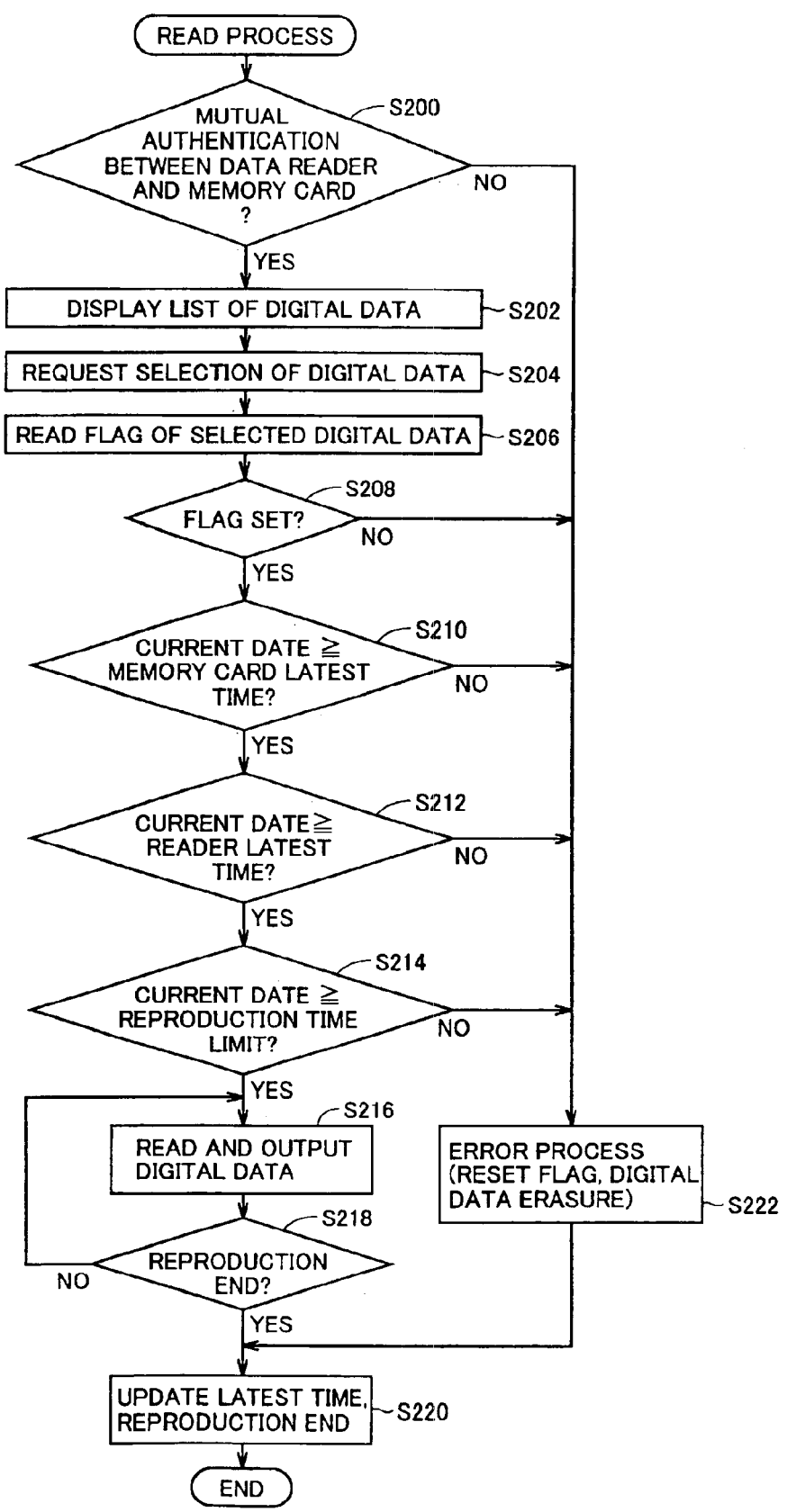
FIG. 7 is a flow chart of a control procedure of a data read process according to an embodiment of the present invention.

Referring to FIG. 7, the program executed by data reader 300 has a control structure set forth below as to a read process.

At S200, CPU 320 of data reader 300 determines whether mutual authentication between data reader 300 and memory card 200 has been verified or not. This mutual verification at S200 is similar to the mutual authentication of S100, provided that data reader 300 is concerned. The user sets memory card 200 in memory card interface 344. The user inputs the user ID through operation unit 354 of data reader 300. CPU 320 reads the secret key recorded in RAM 204 of memory card 200 and the relationship between the secret key and user ID via memory card interface 344. CPU 320 determines whether the secret key stored in RAM 204 of memory card 200 matches the secret key stored in RAM 314 of data reader 300 and whether the user ID stored in RAM 314 in relationship with the matching secret key matches the input user ID. Determination is made that mutual authentication has been verified when respective secret keys and user IDs match each other. When mutual authentication between data reader 300 and memory card 200 has been verified (YES at S200), control proceeds to S202, and otherwise (NO at S200), control proceeds to S222.

At S202, CPU 320 displays a list of the digital data recorded in memory card 200 at display unit 352 using the index of the digital data stored in RAM 204 of memory card 200.

At S204, CPU 320 requests the user to select the digital data to be reproduced. Here, a request to select digital data from the list at display unit 352 is provided at display unit 352.

At S206, CPU 320 reads the flag of the selected digital data. At S208, CPU 320 determines whether the read flag is set or not. When the flag is set (YES at S208), control proceeds to S210, and otherwise (NO at S208), control proceeds to S222.

At S210, CPU 320 determines whether the current date detected by real time clock 330 is later than or equal to "the latest time of memory card" recorded in memory card 200. When the detected current date is later than or equal to "the latest time of memory card" (YES at S210), control proceeds to S212, and otherwise (NO at S210), control proceeds to S222.

At S212, CPU 320 determines whether the current date detected by real time clock 330 is later than or equal to "the latest time of reader" stored in nonvolatile memory 316. When the detected current date is later than or equal to "the latest time of reader" (YES at S212), control proceeds to S214, and otherwise (NO at S212), control proceeds to S222.

The case where the detected current date is earlier than "the latest time of memory card" or "the latest time of reader" corresponds to the case where the current date has been put forward. This means that the user has deceitfully operated real time clock 330 of data reader 300 for the purpose of fraudulent reproduction after expiration of the reproduction time limit.

At S214, CPU 320 determines whether the current date detected by real time clock 330 is before or equal to the reproduction time limit recorded in memory card 200. When the detected current date is before or equal to the reproduction time limit (YES at S214), control proceeds to S216, and otherwise (NO at S214), control proceeds to S222.

At S216, CPU 320 reads out the digital data selected at S204 from RAM 204 of memory card 200. The digital data encrypted by the reproduction key is decrypted and output from display unit 352 and audio output unit 356. The reproduction key is a decrypted version of the reproduction key encrypted using a secret key.

At S218, CPU 320 determines whether reproduction has ended or not. Upon completion of digital data reproduction (YES at S218), control proceeds to S220, and otherwise (NO at S218), control returns to S216 to further carry out reproduction of digital data.

At S220, CPU 320 overwrites "the latest time of reader" recorded in nonvolatile memory 316 and "the latest time of memory card" recorded in memory card 200 with the current date detected by real time clock 330. Accordingly, "the latest time of reader" and "the latest time of memory card" are updated, and the reproduction process ends.

When mutual authentication is not verified (NO at S200), when the flag is reset (NO at S208), when the current date is earlier than "the latest time of memory card" (NO at S210), when the current date is earlier than "the latest time of reader" (NO at S212), or when the current date is later than the reproduction time limit (NO at S214), CPU 320 carries out an error process at S222. In this error process, CPU 320 resets the flag and erases the digital data.

Failure of mutual authentication means that an improper user has used memory card 200. Therefore, all the digital data recorded in memory card 200 is erased. In the case where the current date is before "the latest time of memory card" and the current time is before "the latest time of reader", determination is made that real time clock 330 of data reader 300 has been operated improperly. Therefore, all the digital data recorded in memory card 200 is erased. In the case where the current date is after the reproduction time limit, only the digital data corresponding to the elapsed reproduction time limit is erased.

The operation of a data reproduction system according to the above-described structure and flow charts will be described hereinafter.

Data Record Operation: Memory Card Initialization

In order to initialize memory card 200, the user sets memory card 200 in data recorder 100. Upon the request of memory card initialization by the user, data recorder 100 selects a user ID and secret key. The selected user ID and secret key are displayed on display unit 152. The secret key is recorded in RAM 204 of memory card 200. The relationship between the secret key and user ID is recorded in RAM 114 of data recorder 100.

Data Record Operation

The operation of recording digital data into an initialized memory card 200 will be described here. The user establishes connection between the initialized memory card 200 and data recorder 100 via memory card interface 144 of data recorder 100. The user inputs his/her own user ID through operation unit 152. Data recorder 100 reads out the secret key from memory card 200. Mutual authentication between data recorder 100 and memory card 200 is conducted based on the secret key read out and the secret key stored in ROM 112 as well as the relationship between the secret key and user ID stored in RAM 114 and the input user ID.

When mutual authentication is verified (YES at S100), a list of digital data is provided on display unit 152 based on the index of digital data stored in nonvolatile memory 116 (S102). The user selects the digital data to be recorded in memory card 200 from the displayed list. The selected digital data is recorded in RAM 204 of memory card 200 (S106). Here, the digital data recorded in RAM 204 is encrypted using a reproduction key.

The current date detected by real time clock 130 is recorded as "the latest time of memory card" (S108). Monitor information is generated and recorded in RAM 204 of memory cad 200 (S110). Thus, the digital data as shown in FIG. 5 is recorded in memory card 200 of a user.

Data Read Operation: Data Reader Initialization

A user initializes data reader 300 to reproduce data from memory card 200 through data reader 300. For initialization of data reader 300, the user enters his/her user ID and secret key through operation unit 354. Data reader 300 stores the user ID and secret key in RAM 314.

Data Read Operation: Mutual Authentication

The operation of reading out digital data recorded in memory card 200 using an initialized data reader 300 will be described here. Prior to reading out digital data, mutual authentication is conducted.

The user establishes connection between memory card 200 in which digital data is recorded and data reader 300 via memory card interface 344 of data reader 300. The user enters his/her user ID through operation unit 354. Data reader 300 reads out the secret key from memory card 200. Mutual authentication between data reader 300 and memory card 200 is conducted based on the secret key read out and the secret key stored in RAM 314 as well as the relationship between the secret key and the user ID stored in RAM 314 and the input user ID.

When mutual authentication is verified (YES at S200), a list of digital data is provided on display unit 352 based on the index of the digital data recorded in RAM 204 of memory card 200 (S202). The user selects the digital data to be reproduced recorded in memory card 200 from the displayed list. Description is provided hereinafter with discrimination between a proper operation and an improper operation.

Data Read Operation: First Proper Operation

A first proper operation of data reader 300 will be described with reference to FIG. 8. It is assumed that digital data is recorded in memory card 200 by data recorder 100 on Jan. 1, 2001. It is assumed that the reproduction time limit of this digital data is Jan. 6, 2001. By the recording operation of data recorder 100, Jan. 1, 2001 is recorded as "the latest time of memory card" in RAM 204 of memory card 200. The latest time is not limited to the aforementioned date, and may include even the hour, minute and second.

Figure 8:
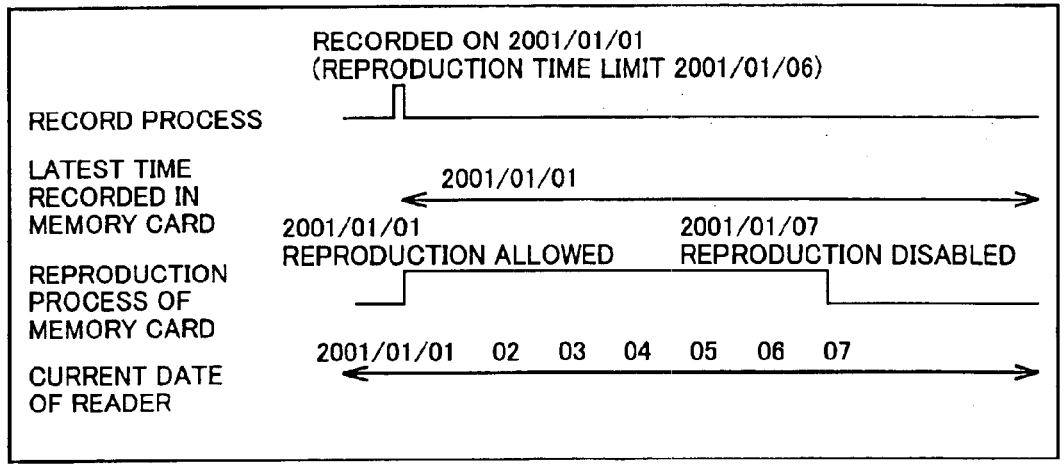
FIG. 8 shows a first proper operation according to an embodiment of the present invention.

As shown in FIG. 8, the digital data recorded in memory card 200 is reproducible from Jan. 1, 2001 to Jan. 6, 2001, and cannot be reproduced from Jan. 7, 2001 and afterwards. The current date detected by real time clock 330 sequentially changes from Jan. 1, 2001 to Jan. 7, 2001.

Consider the case where digital data is to be reproduced using data reader 300 on Jan. 4, 2001 before the reproduction time limit. The current date (Jan. 4, 2001) is later than "the latest time of memory card" (Jan. 1, 2001) (YES at S210); the current date (Jan. 4, 2001) is equal to "the latest time of reader" (Jan. 4, 2001) (YES at S212); and the current date (Jan. 4, 2001) is before the reproduction time limit (Jan. 6, 2001) (YES at S214). Therefore, the digital data is read out from memory card 200 to be output (S216).

Consider the case where digital data is to be reproduced using data reader 300 on Jan. 7, 2001 after the reproduction time limit. The current date (Jan. 7, 2001) is later than "the latest time of memory card" (Jan. 1, 2001) (YES at S210); the current time (Jan. 7, 2001) is equal to "the latest time of reader" (Jan. 7, 2001) (YES at S212); and the current date (Jan. 7, 2001) is after the reproduction time limit (Jan. 6, 2001) (NO at S214). Therefore, the digital data will not be read out from memory card 200 to be output.

Data Read Operation: First Improper Operation

Figure 9:
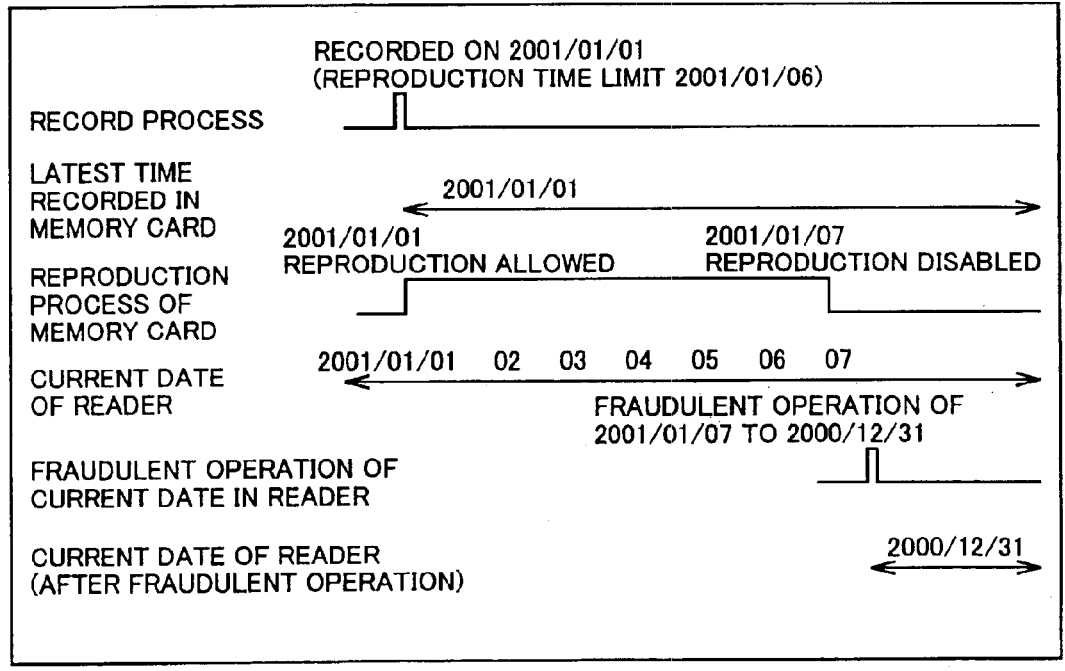
FIG. 9 shows a first improper operation according to an embodiment of the present invention.

The first improper operation at data reader 300 will be described with reference to FIG. 9. It is assumed that the user of data reader 300 improperly operates real time clock 330 to attempt reproduction on Jan. 7, 2001 after the reproduction time limit. It is assumed that the user has improperly modified the current date that is to be detected by real time clock 330 of data reader 300 from Jan. 7, 2001 to Dec. 31, 2000. Accordingly, the current date of data reader 300 becomes Dec. 31, 2000 after the fraudulent operation.

On Jan. 7, 2001, the user reads out the digital data recorded in memory card 200 using data reader 300 that is subjected to fraudulent operation. Here, the current date (Dec. 31, 2000: fraudulent operation) is before "the latest time of memory card" (Jan. 1, 2001), NO at S210). Therefore, an error process is conducted (S222). Determination is made that real time clock 330 of data reader 300 has been operated improperly, and all the digital data recorded in memory card 200 is erased.

Data Read Operation: Second Proper Operation

Figure 10:
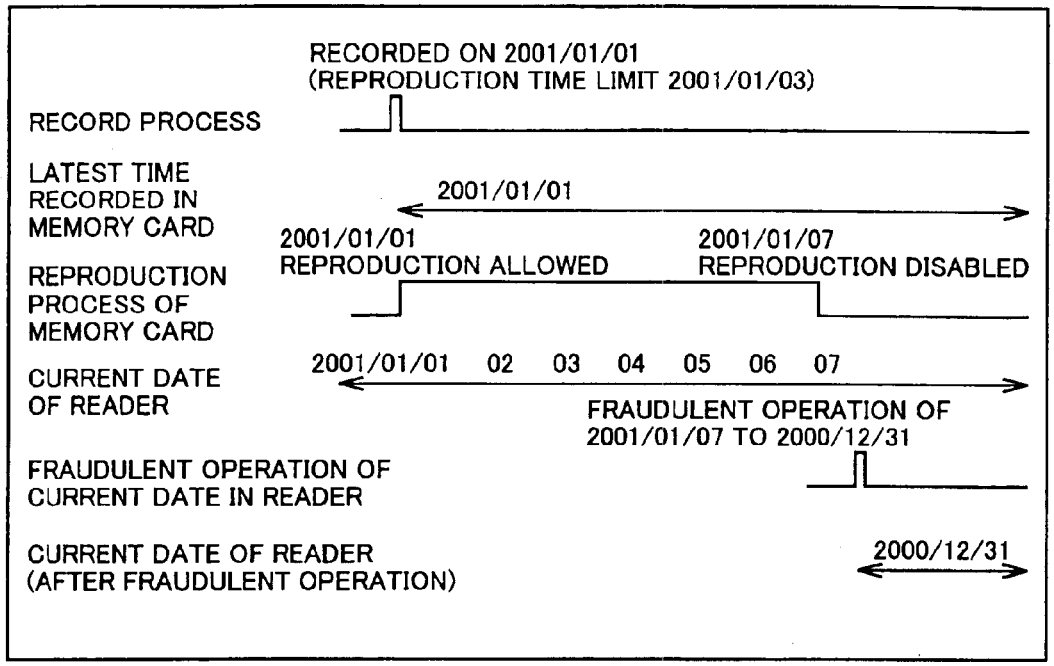
FIG. 10 shows a second proper operation according to an embodiment of the present invention.

The second proper operation of data reader 300 will be described with reference to FIG. 10.

It is assumed that digital data has been recorded into the memory card by data recorder 100 on Jan. 1, 2001. It is assumed that the reproduction time limit of this digital data is Jan. 3, 2001. Jan. 1, 2001 is recorded as "the latest time of memory card" in RAM 204 of the memory card.

Consider the case where digital data recorded in the memory card is to be reproduced using data reader 300 on Jan. 3, 2001 that is within the reproduction time limit. The user sets the memory card in data reader 300. The current date detected by real time clock 330 (Jan. 3, 2001) is after "the latest time of memory card" recorded in the memory card (Jan. 1, 2001) (YES at S210), equal to "the latest time of reader" stored in data reader 300 (Jan. 3, 2001) (YES at S212), and equal to the reproduction time limit (Jan. 3, 2001) (YES at S214). Therefore, digital data is read out from the memory card to be reproduced.

Consider the case where the digital data recorded in the memory card is to be reproduced on Jan. 4, 2001 after the reproduction time limit. In this case, the detected current time (Jan. 4, 2001) is after "the latest time of memory card" (Jan. 1, 2001) (YES at S210), equal to "the latest time of reader" (Jan. 4, 2001) (YES at S212), and has passed the reproduction time limit (Jan. 3, 2001) (NO at S214). Therefore, an error process is conducted (S222). At this stage, the flag corresponding to the relevant digital data is reset, and that digital data is erased.

Data Read Operation: Second Improper Operation

Figure 11:
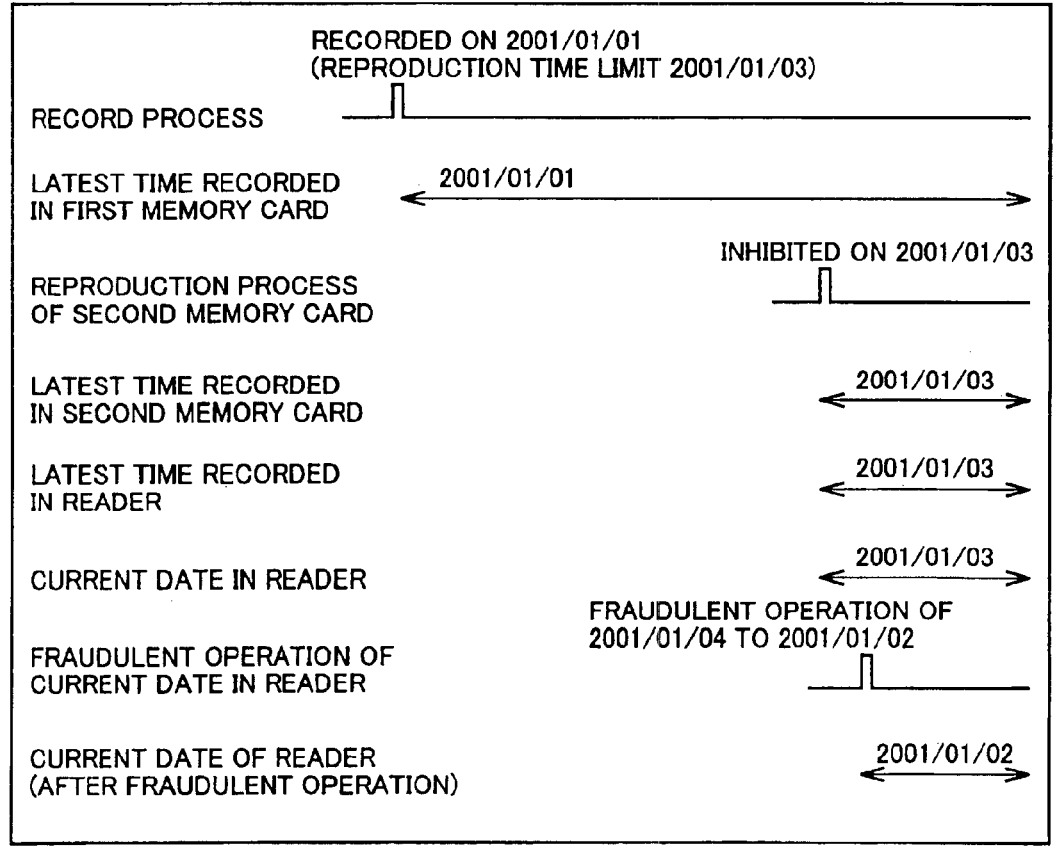
FIG. 11 shows a second improper operation according to an embodiment of the present invention.

A second improper operation at data reader 300 will be described with reference to FIG. 11. The user of data reader 300 possesses two memory cards, i.e. a first memory card and a second memory card. It is assumed that the second memory card is inhibited of digital data reproduction on Jan. 3, 2001. Jan. 3, 2001 is recorded as "the latest time of memory card" in RAM 204 of the second memory card, and recorded as the "latest time of reader" in nonvolatile memory 316. The first memory card is the memory card in the aforementioned second proper operation. It is assumed that the user of data reader 300 improperly operates real time clock 330 on Jan. 4, 2001 after the reproduction time limit to attempt to reproduce digital data. It is assumed that the user has improperly modified the current date to be detected by real time clock 330 of data reader 300 to Jan. 2, 2001 from Jan. 4, 2001. Therefore, the current date of data reader 300 after the fraudulent operation becomes Jan. 2, 2001.

On Jan. 4, 2001, digital data recorded in the first memory card is read out using data reader 300 subjected to fraudulent operation by the user. In this case, the current date (Jan. 2, 2001: after fraudulent operation) is after "the latest time of memory card" (Jan. 1, 2001) (YES at S210), and before "latest time of reader" (Jan. 3, 2001) (NO at S212). Therefore, an error process is conducted (S222). In this case, determination is made that real time clock 330 of data reader 300 has been operated improperly. All the digital data recorded in memory card 200 is erased.

According to the data reproduction system of the present embodiment, the detected current date is recorded into the memory card by the data recorder in recording data by the data recorder. The current date detected by the data reader is stored in the storage unit of the data reader. In a data reproduction mode, fraudulent operation of the current date at the data reader is detected based on "the latest time of memory card" recorded in the memory card and "latest time of reader" stored in the storage unit of the reader as well as the current date detected by the real time clock of the reader. When the current date of the data reader has not been operated improperly and is within the reproduction time limit, the digital data recorded in the memory card is reproduced. Thus, an inexpensive data reproduction system that can output data through the reproduction time limit can be realized.

First Modification of First Embodiment

A first modification of the above first embodiment will be described hereinafter with reference to FIG. 12.

This modification is directed to overwriting "the latest time of memory card" recorded in memory card 200 set in data reader 300 with the current time detected by data reader 300.

Figure 12:
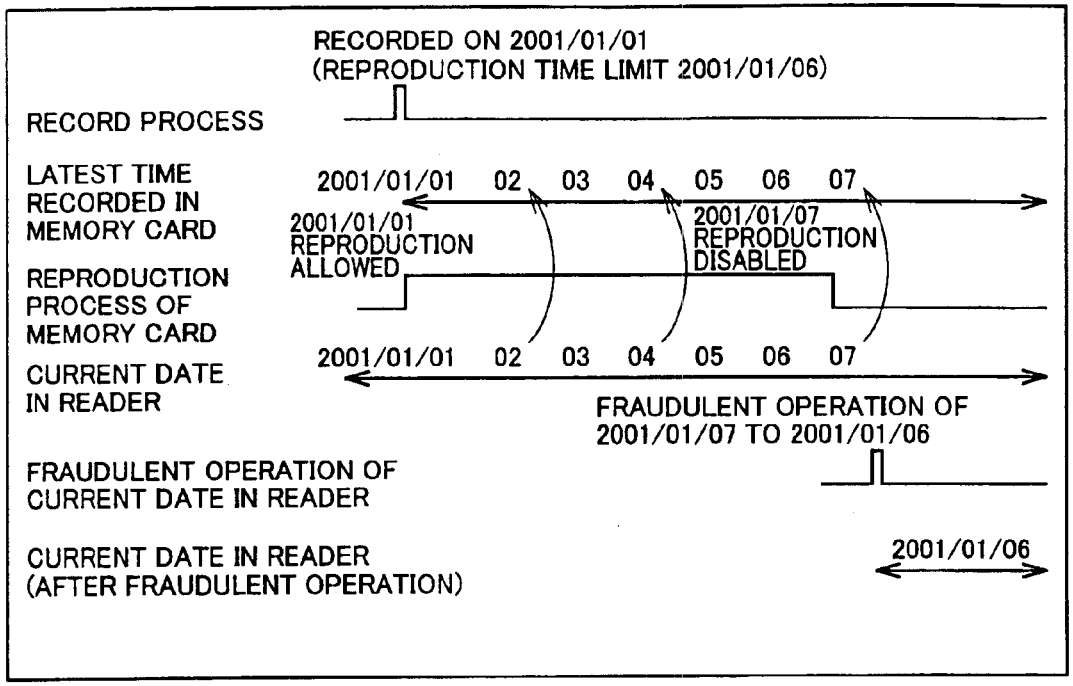
FIGS. 12 and 13 show improper operations of first and second modifications, respectively, of an embodiment of the present invention.

As shown in FIG. 12, "the latest time of memory card" is overwritten with the current date detected by real time clock 330 of data reader 300 for every predetermined time. Therefore, "the latest time of memory card" recorded in memory card 200 is modified over time.

It is assumed that digital data has been recorded into memory card 200 on Jan. 1, 2001 using data recorder 100. It is assumed that the reproduction time limit of this data is Jan. 6, 2001.

Consider the case where the user of data reader 300 improperly operates real time clock 330 on Jan. 7, 2001 after the reproduction time limit to attempt reproduction. It is assumed that the user has modified the current time that is to be detected by real time clock 330 in data reader 300 to Jan. 6, 2001 from Jan. 7, 2001. Therefore, the current date detected by data reader 300 becomes Jan. 6, 2001 after the fraudulent operation.

On Jan. 7, 2001, the user reads out the digital data recorded in memory card 200 using data reader 300 subjected to fraudulent operation. In this case, the current date (Jan. 6, 2001: after fraudulent operation) is before "the latest time of memory card" (Jan. 7, 2001), (NO at S210). Therefore, an error process is conducted (S222). Determination is made that real time clock 330 in data reader 300 has been operated improperly, and all the digital data recorded in memory card 200 is erased.

Second Modification of the First Embodiment

Figure 13:
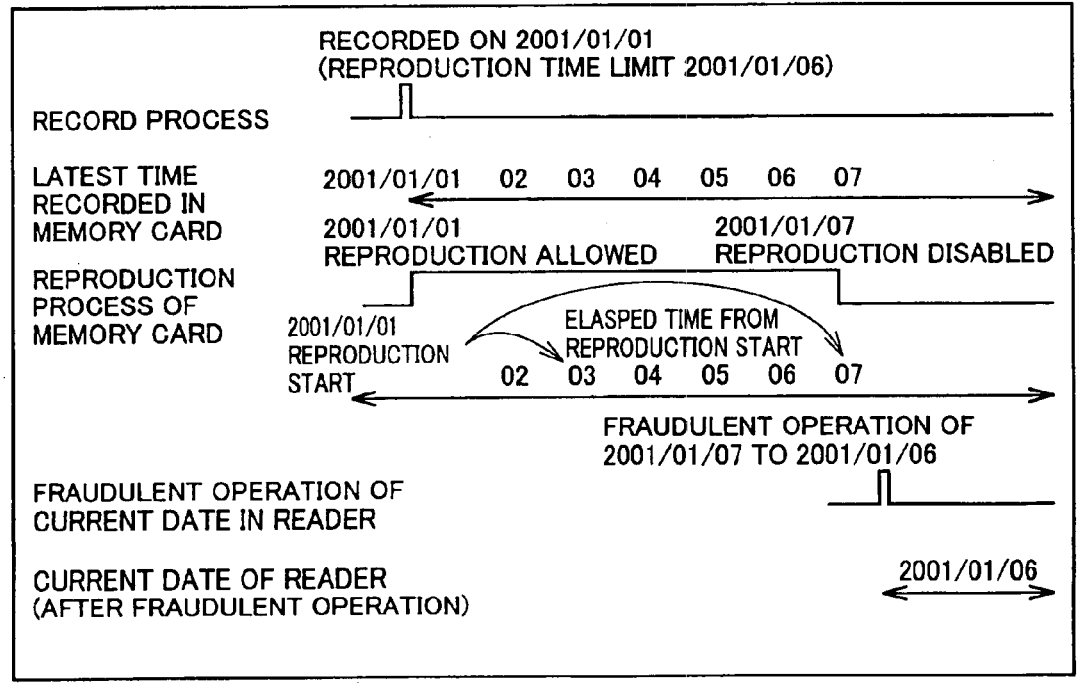

A second modification of the first embodiment will be described with reference to FIG. 13. The second modification is directed to recording "the latest time of memory card" independent of the current date detected by real time clock 330 of data recorder 300.

Data reader 300 of the second modification includes a counter that can calculate the elapsed time in addition to real time clock 330. As shown in FIG. 13, upon commencing reproduction of the digital data recorded in memory card 200 on Jan. 1, 2001, the elapsed time from the start of reproduction is detected by the counter. The elapsed time detected by the counter is added to the current date detected when reproduction is commenced to calculate the current date.

Thus, "the latest time of memory card" is recorded properly in memory card 200 even in the case where real time clock 330 is not subjected to fraudulent operation at the time of commencing reproduction and subjected to fraudulent operation after reproduction is commenced (for example, in the case where real time clock 330 is subjected to fraudulent operation on Jan. 4, 2001).

The operation of real time clock 330 operated improperly on January 7 in data reader 300 of the second modification is similar to that of the first modification. Therefore, detailed description thereof will not be repeated here.

According to the second modification, advantages similar to those of the first embodiment can be obtained. An inexpensive data reproduction system monitoring reproduction time limit to reproduce digital data can be realized.

Second Embodiment

The second embodiment is directed to recording media of types other than that of the memory card of the previous first embodiment. The remaining elements of the second embodiment other than the change in the structure of the recording medium are similar to those of the first embodiment. Therefore, detailed description of the remaining elements will not be repeated here.

Figure 14:
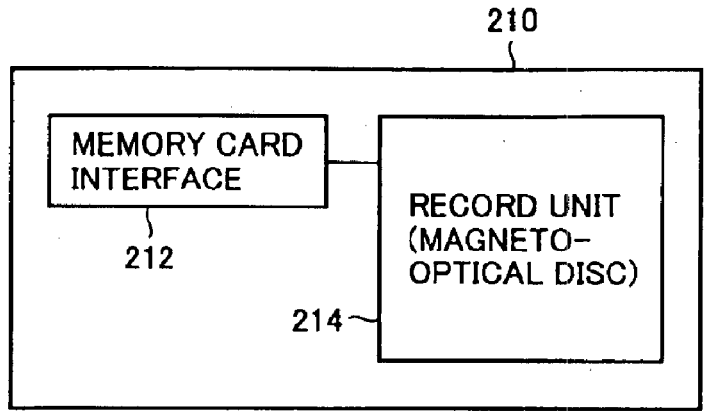
FIGS. 14–18 are control block diagrams of a recording medium.

Referring to FIG. 14, a recording medium 210 alternative to memory card 200 includes a memory card interface 212, and a record unit 214 connected to memory card interface 212 and realized by a magneto-optical disc. Since record unit 214 is realized by a magneto-optical disc, digital data of a large amount (digital data representing video of high definition) can be recorded.

Figure 15:
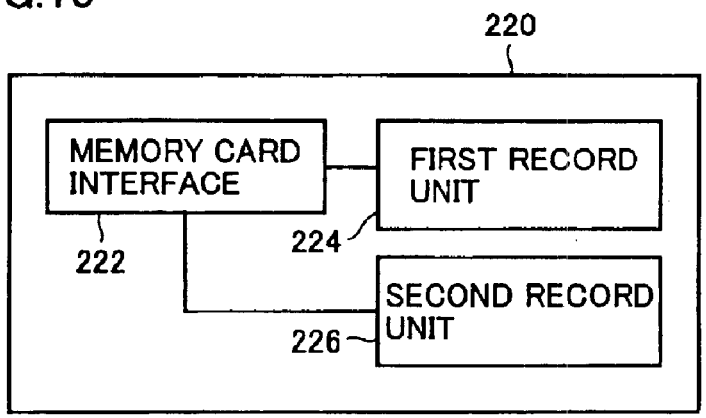

Referring to FIG. 15, a recording medium 220 alternative to memory card 200 includes a memory card interface 222, a first record unit 224 recording data that has to be rewritten, and a second record unit 226 recording data that does not have to be rewritten. First and second record units 224 and 226 are connected to memory card interface 222. "The latest time of memory card", a secret key, and the like are recorded in first record unit 224. Digital data that does not have to be rewritten is stored in second record unit 226.

According to the second embodiment, data recorder 100 shown in FIG. 1 is dispensable. The user purchases a recording medium 220 having digital data prerecorded in second record unit 226. By setting recording medium 220 in data reader 300, the digital data recorded in second record unit 226 can be reproduced.

Figure 16:
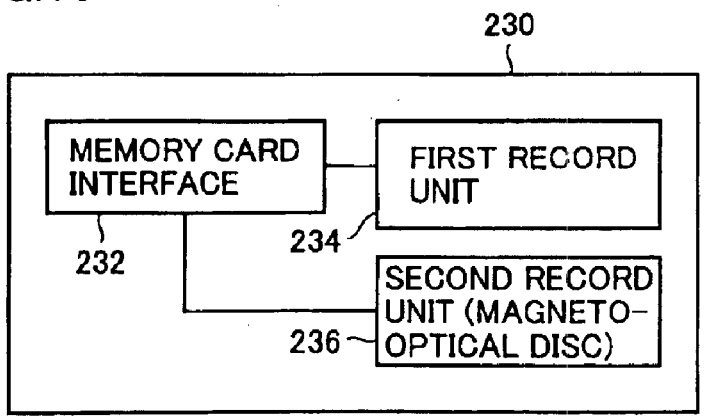

Referring to FIG. 16, a recording medium 230 includes a second record unit 236 having second record unit 226 of recording medium 220 of FIG. 15 realized by a magneto-optical disc. Recording medium 230 of FIG. 16 has the advantage of recording digital data of a large amount in second record unit 236 in addition to the advantage of recording medium 220 of FIG. 15.

Figure 17:
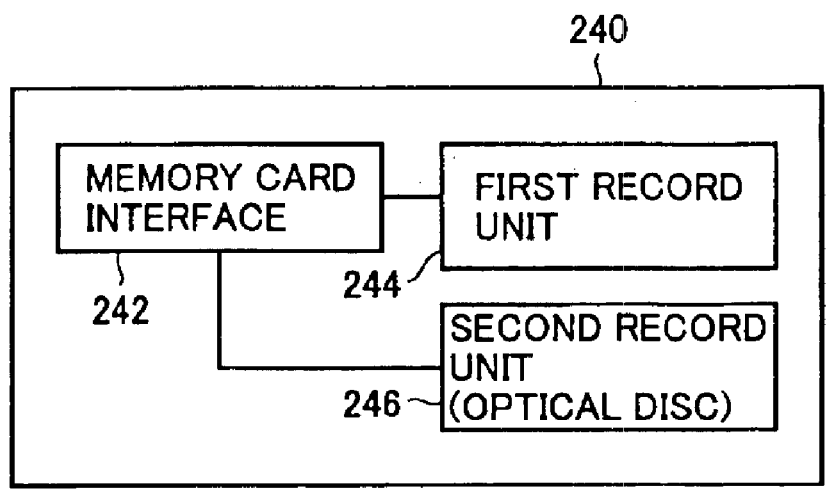

Referring to FIG. 17, a recording medium 240 includes a second record unit 246 having second record unit 236 of recording medium 230 of FIG. 16 realized by an optical disc dedicated to reading.

Figure 18:
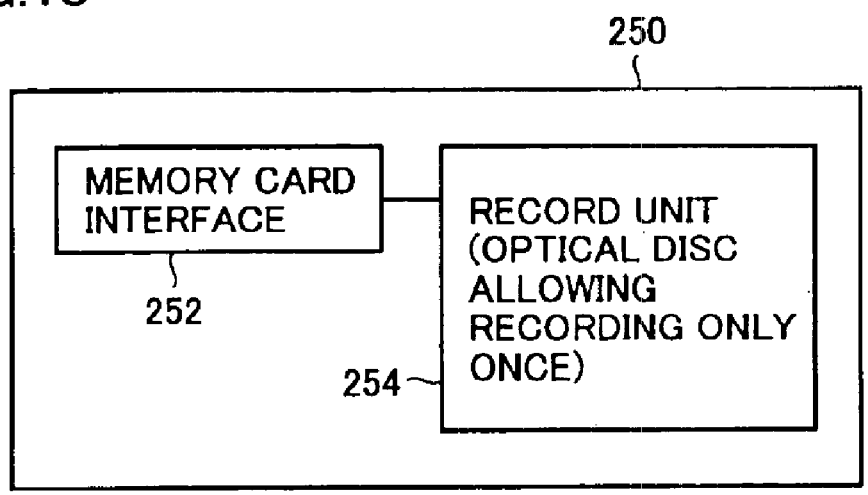

Referring to FIG. 18, a recording medium 250 alternative to memory card 200 of the first embodiment includes a memory card interface 252, and a record unit 254 connected to memory card interface 252. Record unit 254 employs an optical disc that can be recorded only one. Record unit 254 is recorded with digital data that does not have to be rewritten, in an encrypted form. Also, monitor information is recorded in record unit 254.

The data recorded in record unit 254 of recording medium 250 of FIG. 18 will be described with reference to FIG. 19. First digital data encrypted using a reproduction key and second digital data encrypted using a reproduction key are recorded in record unit 254. As the initial monitor information, a secret key, a reproduction key encrypted using the secret key, and the latest time of the initialized state are recorded. As the initial monitor information, monitor information for the recorded first and second digital data is recorded. For example, the first monitor information includes a data ID, a file name, index data, a reproduction time limit, and a flag.

Figure 19:
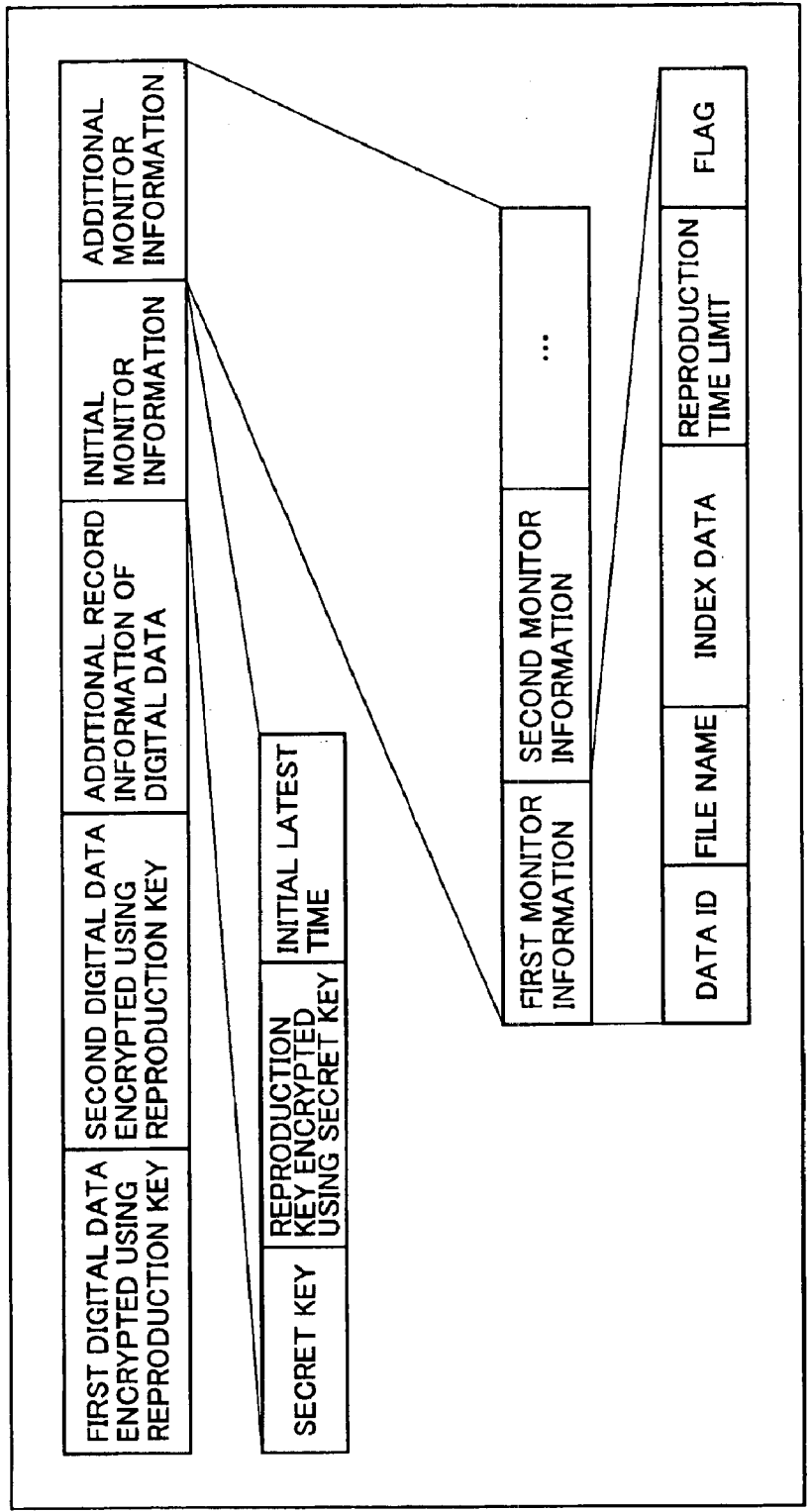
FIG. 19 shows data recorded in a recording medium.

As shown in FIG. 19, record unit 254 includes additional record information of digital data. The additional monitor information includes monitor information of the digital data recorded in addition to the first and second digital data. This monitor information is recorded additionally.

As shown in FIGS. 18 and 19, record unit 254 is formed using an optical disc that can be recorded only once. Digital data is added to record unit 254. Monitor information corresponding to the additionally-recorded digital data is added into record unit 254. Accordingly, recording medium 250 recorded with digital data can be realized.

Advantages similar to those of the previous first embodiment can be realized through the recording medium of the second embodiment.

Although the present invention has been described and illustrated in detail, it is clearly understood that the same is by way of illustration and example only and is not to be taken by way of limitation, the spirit and scope of the present invention.

What is claimed is:

1. A data reproduction system reading out, using a data reader, data recorded in a recording medium using a data recorder, said data recorder comprising:

a storage circuit storing data,
a detection circuit detecting a date,
a set circuit setting a time limit allowing output of said data using said data reader, and
a record circuit connected to said storage circuit, said detection circuit and said set circuit to record the data stored in said storage circuit, the time limit set by said set circuit, and a recorded date of recording said data and said time limit detected by said detection circuit into said recording medium, said data reader comprising:
a detection circuit detecting a date,
a read circuit reading out said time limit and said recorded date from said recording medium,
a determination circuit connected to said detection circuit and said read circuit of said data reader to determine whether output of said data recorded in said recording medium is allowed or not based on said time limit and said recorded date read out by said read circuit and a current date detected by said detection circuit,
an output circuit connected to said determination circuit to read out said data from said recording medium for output when output of said data is allowed, and
an overwrite circuit connected to the detection circuit of said data reader to overwrite the recorded date recorded in said recording medium with the current date detected by said detection circuit.

2. The data reproduction system according to claim 1, wherein said determination circuit comprises includes a circuit determining that output of said data recorded in said recording medium is allowed when said current date is after said recorded data and before said time limit.

3. A data reproduction system reading out, using a data reader, data recorded in a recording medium using a data recorder, said data recorder comprising:
a storage circuit storing data,
a detection circuit detecting a date,
a set circuit setting a time limit allowing output of said data using said data reader, and
a record circuit connected to said storage circuit, said detection circuit and said set circuit to record the data stored in said storage circuit, the time limit set by said set circuit, and a recorded date of recording said data and said time limit detected by said detection circuit into said recording medium, said data reader comprising:
a detection circuit detecting a date,
a read circuit reading out said time limit and said recorded date from said recording medium,
a determination circuit connected to said detection circuit and said read circuit of said data reader to determine whether output of said data recorded in said recording medium is allowed or not based on said time limit and said recorded date read out by said read circuit and a current date detected by said detection circuit, and
an output circuit connected to said determination circuit to read out said data from said recording medium for output when output of said data is allowed,
wherein said detection circuit of said data reader includes:
a circuit detecting a date of commencing output of said data,
a circuit detecting an elapsed time from said date of commencing output, and
a circuit detecting a current date based on said date of commencing output and said elapsed time.

4. A data reproduction system reading out, using a data reader, data recorded in a recording medium using a data recorder, said data recorder comprising:
a storage circuit storing data,
a detection circuit detecting a date,
a set circuit setting a time limit allowing output of said data using said data reader, and
a record circuit connected to said storage circuit, said detection circuit and said set circuit to record the data stored in said storage circuit, the time limit set by said set circuit, and a recorded date of recording said data and said time limit detected by said detection circuit into said recording medium, said data reader comprising:
a detection circuit detecting a date,
a read circuit reading out said time limit and said recorded date from said recording medium,
a determination circuit connected to said detection circuit and said read circuit of said data reader to determine whether output of said data recorded in said recording medium is allowed or not based on said time limit and said recorded date read out by said read circuit and a current date detected by said detection circuit,
an output circuit connected to said determination circuit to read out said data from said recording medium for output when output of said data is allowed, and
an incorrect date detection circuit detecting that said current date is incorrect when said current date is before said recorded date.

5. The data reproduction system according to claim 4, said data reader further including a processing circuit connected to said incorrect date detection circuit disabling output of said data from said recording medium when detection is made that said current date is incorrect.

6. A data reproduction system reading out, using a data reader, data recorded in a recording medium using a data recorder, said data recorder comprising:
a storage circuit storing data,
a detection circuit detecting a date,
a set circuit setting a time limit allowing output of said data using said data reader, and
a record circuit connected to said storage circuit, said detection circuit and said set circuit to record the data stored in said storage circuit, the time limit set by said set circuit and a recorded date of recording said data and said time limit detected by said detection circuit into said recording medium, said data reader comprising:
a detection circuit detecting a date,
a read circuit reading out said time limit and said recorded date from said recording medium,
a determination circuit connected to said detection circuit and said read circuit of said data reader to determine whether output of said data recorded in said recording medium is allowed or not based on said time limit and said recorded date read out by said read circuit and a current date detected by said detection circuit,
an output circuit connected to said determination circuit to read out said data from said recording medium for output when output of said data is allowed, and
a monitor date storage circuit connected to said detection circuit of said data reader to store the date detected by the detection circuit of said data reader as a monitor date, wherein said determination circuit comprises a circuit determining whether output of said data recorded in said recording medium is allowed or not based on said time limit, said recorded date, said monitor date and said current date.

7. The data reproduction system according to claim 6, wherein said determination circuit comprises a circuit determining that output of said data recorded in said recording medium is allowed when said current date is after said recorded date, after said monitor date, and before said time limit.

8. The data reproduction system according to claim 7, said data reader further comprising an incorrect date detection circuit detecting that said current date is incorrect when said current date is before said monitor date.

9. A data reader used in a data reproduction system reading out, using a data reader, data written into a recording medium using a data recorder, said data recorder recording into said recording medium said data, a time limit allowing output of said data using said data reader, and a recorded date of recording said data and said time limit in said recording medium, said data reader comprising:
 a detection circuit detecting a date,
 a read circuit reading out said time limit and said recorded date from said recording medium,
 a determination circuit connected to said detection circuit and said read circuit of said data reader to determine whether output of said data recorded in said recording medium is allowed or not based on said time limit and said recorded date read out by said read circuit, and a current date detected by said detection circuit,
 an output circuit connected to said determination circuit to read out said data from said recording medium for output when output of said data is allowed, and
 an overwrite circuit connected to said detection circuit of said data reader to overwrite the recorded date recorded in said recording medium with the current date detected by said detection circuit.

10. The data reader according to claim 9, wherein said determination circuit comprises a circuit determining that output of said data recorded in said recording medium is allowed when said current date is after said recorded date and before said time limit.

11. A data reader used in a data reproduction system reading out, using a data reader, data written into a recording medium using a data recorder, said data recorder recording into said recording medium said data, a time limit allowing output of said data using said data reader, and a recorded date of recording said data and said time limit in said recording medium, said data reader comprising:
 a detection circuit detecting a date,
 a read circuit reading out said time limit and said recorded date from said recording medium,
 a determination circuit connected to said detection circuit and said read circuit of said data reader to determine whether output of said data recorded in said recording medium is allowed or not based on said time limit and said recorded date read out by said read circuit, and a current date detected by said detection circuit, and
 an output circuit connected to said determination circuit to read out said data from said recording medium for output when output of said data is allowed, wherein said detection circuit comprises:
 a circuit detecting a date of commencing output of said data,
 a circuit detecting an elapsed time from said date of commencing output.

12. A data reader used in a data reproduction system reading out, using a data reader, data written into a recording medium using a data recorder, said data recorder recording into said recording medium said data, a time limit allowing output of said data using said data reader, and a recorded date of recording said data and said time limit in said recording medium, said data reader comprising:
 a detection circuit detecting a date,
 a read circuit reading out said time limit and said recorded date from said recording medium,
 a determination circuit connected to said detection circuit and said read circuit of said data reader to determine whether output of said data recorded in said recording medium is allowed or not based on said time limit and said recorded date read out by said read circuit, and a current date detected by said detection circuit,
 an output circuit connected to said determination circuit to read out said data from said recording medium for output when output of said data is allowed, and
 an incorrect date detection circuit detecting that said current date is incorrect when said current date is before said recorded date.

13. The data reader according to claim 12, further comprising a processing circuit connected to said incorrect date detection circuit to disable output of said data from said recording medium when detection is made that said current date is incorrect.

14. A data reader used in a data reproduction system reading out, using a data reader, data written into a recording medium using a data recorder, said data recorder recording into said recording medium said data, a time limit allowing output of said data using said data reader, and a recorded date of recording said data and said time limit in said recording medium, said data reader comprising:
 a detection circuit detecting a date,
 a read circuit reading out said time limit and said recorded date from said recording medium,
 a determination circuit connected to said detection circuit and said read circuit of said data reader to determine whether output of said data recorded in said recording medium is allowed or not based on said time limit and said recorded date read out by said read circuit, and a current date detected by said detection circuit,
 an output circuit connected to said determination circuit to read out said data from said recording medium for output when output of said data is allowed, and
 a monitor date storage circuit connected to the detection circuit of said data reader to store the date detected by the detection circuit of said data reader as a monitor date,
 wherein said determination circuit comprises a circuit determining whether output of said data recorded in said recording medium is allowed or not based on said time limit, said recorded date, said monitor date and said current date.

15. The data reader according to claim 14, wherein said determination circuit comprises a circuit determining that output of said data recorded in said recording medium is allowed when said current date is after said recorded date, after said monitor date and before said time limit.

16. The data reader according to claim 15, further comprising an incorrect date detection circuit detecting that said current date is incorrect when said current date is before said monitor date.

17. A data reproduction system reading out, using a data reader, data written in a recording medium using a data recorder,
said data recorder comprising:
storage means for storing data,
detection means for detecting a date,
set means for setting a time limit allowing output of said data using said data reader, and
record means connected to said storage means, said detection means and said set means for recording the data stored in said storage means, the time limit set by said set means, and a recorded date of recording said data and said time limit, detected by said detection means into said recording medium,
said data reader comprising:
detection means for detecting a date,
read means for reading said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means,
output means connected to said determination means to read out said data from said recording means for output when output of said data is allowed, and
overwrite means connected to said detection means of said data reader for overwriting the recorded date recorded in said recording medium with the current date detected by said detection means.

18. The data reproduction system according to claim 17, wherein said determination means comprises means for determining that output of said data recorded in said recording medium is allowed when said current date is after said recorded date and before said time limit.

19. A data reproduction system reading out, using a data reader, data written in a recording medium using a data recorder
said data recorder comprising:
storage means for storing data,
detection means for detecting a date
set means for setting a time limit allowing output of said data using said data reader, and
record means connected to said storage means, said detection means and said set means for recording the data stored in said storage means, the time limit set by said set means, and a recorded date of recording said data and said time limit, detected by said detection means into said recording medium,
said data reader comprising:
detection means for detecting a date,
read means for reading said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means, and
output means connected to said determination means to read out said data from said recording means for output when output of said data is allowed,
wherein said detection means of said data reader comprises:
means for detecting a date of commencing output of said data,
means for detecting an elapsed time from said date of commencing output, and
means for detecting a current date based on said date of commencing output and said elapsed time.

20. A data reproduction system reading out, using a data reader, data written in a recording medium using a data recorder,
said data recorder comprising:
storage means for storing data,
detection means for detecting a date,
set means for setting a time limit allowing output of said data using said data reader, and
record means connected to said storage means, said detection means and said set means for recording the data stored in said storage means, the time limit set by said set means, and a recorded date of recording said data and said time limit, detected by said detection means into said recording medium.
said data reader comprising:
detection means for detecting a date,
read means for reading said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means,
output means connected to said determination means to read out said data from said recording means for output when output of said data is allowed, and
incorrect date detection means for detecting that said current date is incorrect when said current date is before said recorded date.

21. The data reproduction system according to claim 20, said data reader further comprising processing means connected to said incorrect date detection means for disabling output of said data from said recording medium when detection is made that said current date is incorrect.

22. A data reproduction system reading out, using a data reader, data written in a recording medium using a data recorder, said data recorder comprising:
said data recorder comprising:
detection means for detecting a date,
set means for setting a time limit allowing output of said data using said data reader, and
record means connected to said storage means, said detection means and said set means for recording the data stored in said storage means, the time limit set by said set means and a recorded date of recording said data and said time limit, detected by said detection means into said recording medium,
said data reader comprising:
detection means for detecting a date,
read means for reading said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means, output means connected to said determination means to read out said data from said recording means for output when output of said data is allowed, and monitor date storage means connected to said detection means of said data reader for storing the date detected by said detection means of said data reader as a monitor date, wherein said determination means comprises means for determining whether output of said data recorded in said recording medium is allowed or not based on said time limit, said recorded date, said monitor date and said current date.

23. The data reproduction system according to claim 22, wherein said determination means comprises means for determining that output of said data recorded in said recording medium is allowed when said current date is after said recorded date, after said monitor date, and before said time limit.

24. The data reproduction system according to claim 23, said data reader further comprising incorrect date detection means for detecting that said current date is incorrect when said current date is before said monitor date.

25. A data reader used in a data reproduction system reading out, using the data reader, data recorded in a recording medium using a data recorder, said data recorder recording said data, a time limit allowing output of said data using said data reader, and a recorded date of said data and said time limit being recorded in said recording medium into said recording medium, said data reader comprising:
detection means for detecting a date,
read means for reading out said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means,
output means connected to said determination means to read out said data from said recording medium for output when output of said data is allowed, and
overwrite means connected to said detection means of said data reader for overwriting the recorded date recorded in said recording medium with the current date detected by said detection means.

26. The data reader according to claim 25, wherein said determination means comprises means for determining that output of said data recorded in said recording medium is allowed when said current dare is after said recorded date and before said time limit.

27. A data reader used in a data reproduction system reading out, using the data reader, data recorded in a recording medium using a data recorder, said data recorder recording said data, a time limit allowing output of said data using said data reader, and a recorded date of said data and said time limit being recorded in said recording medium into said recording medium, said data reader comprising:
detection means for detecting a date,
read means for reading out said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means, and
output means connected to said determination means to read out said data from said recording medium for output when output of said data is allowed,
wherein said detection means comprises:
means for detecting a date of commencing output of said data,
means for detecting an elapsed time from said date of commencing output, and
means for detecting the current date based on said date of commencing output and said elapsed time.

28. A data reader used in a data reproduction system reading out, using the data reader, data recorded in a recording medium using a data recorder, said data recorder recording said data, a time limit allowing output of said data using said data reader, and a recorded date of said data and said time limit being recorded in said recording medium into said recording medium, said data reader comprising:
detection means for detecting a date,
read means for reading out said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means,
output means connected to said determination means to read out said data from said recording medium for output when output of said data is allowed, and
incorrect date detection means for detecting that said current date is incorrect when said current date is before said recorded date.

29. The data reader according to claim 28, further comprising processing means connected to said incorrect date detection means for disabling output of said data from said recording medium when detection is made that said current date is incorrect.

30. A data reader used in a data reproduction system reading out, using the data reader, data recorded in a recording medium using a data recorder, said data recorder recording said data, a time limit allowing output of said data using said data reader, and a recorded date of said data and said time limit being recorded in said recording medium into said recording medium, said data reader comprising:
detection means for detecting a date,
read means for reading out said time limit and said recorded date from said recording medium,
determination means connected to said detection means and said read means of said data reader for determining whether output of said data recorded in said recording medium is allowed or not based on said time limit and said recorded date read out by said read means and a current date detected by said detection means, output means connected to said determination means to read out said data from said recording medium for output when output of said data is allowed, and monitor date storage means connected to said detection means of said data reader for storing the date detected by said detection means of said data reader as a monitor date, wherein said determination means comprises means for determining whether output of said data recorded in said recording medium is allowed or not based on said time limit, said recorded date, said monitor date and said current date.

31. The data reader according to claim 30, wherein said determination means comprises means for determining that output of said data recorded in said recording medium is allowed when said current date is after said recorded date, after said monitor date and before said time limit.

32. The data reader according to claim 31, said data reader further comprising incorrect date detection means for detecting that said current date is incorrect when said current date is before said monitor date.

33. A data read method in a data reader used in a data reproduction system reading out, using a data reader, data recorded in a recording medium using a data recorder, said data recorder recording into said recording medium said data, a time limit allowing output of said data using said data reader, and a recorded date of recording said data and said time limit in said recording medium, said data read method comprising the steps of:
detecting a date,
reading out said time limit and said recorded date from said recording medium, and
determining whether output of said data recorded in said recording medium is allowed or not based on said time limit and said recorded date read out, and a current date detected at said step of detecting a date,
reading out said data from said recording medium for output when output of said data is allowed, and
overwriting the recorded date recorded in said recording medium with the current date detected at said step of detecting a date.

34. The data read method according to claim 33, wherein said step of determining whether output of data is allowed or not comprises the step of determining that output of said data recorded in said recording medium is allowed when said current date is after said recorded date and before said time limit.

35. A data read method in a data reader used in a data reproduction system reading out, using a data reader, data recorded in a recording medium using a data recorder, said data recorder recording into said recording medium said data, a time limit allowing output of said data using said data reader, and a recorded date of recording said data and said time limit in said recording medium, said data read method comprising the steps of:
detecting a date,
reading out said time limit and said recorded date from said recording medium, and
determining whether output of said data recorded in said recording medium is allowed or not based on said time limit and said recorded date read out, and a current date detected at said step of detecting a date, and
reading out said data from said recording medium for output when output of said data is allowed,
wherein said step of detecting a date comprises the steps of:
detecting a date of commencing output of said data,
detecting an elapsed time from said date of commencing output, and
detecting the current date based on said date of commencing output and said elapsed time.

36. A data read method in a data reader used in a data reproduction system reading out, using a data reader, data recorded in a recording medium using a data recorder, said data recorder recording into said recording medium said data, a time limit allowing output of said data using said data reader, and a recorded date of recording said data and said time limit in said recording medium, said data read method comprising the steps of:
detecting a date,
reading out said time limit and said recorded date from said recording medium, and
determining whether output of said data recorded in said recording medium is allowed or not based on said time limit and said recorded date read out, and a current date detected at said step of detecting a date,
reading out said data from said recording median for output when output of said data is allowed, and
detecting that said current date is incorrect when said current date is before said recorded date.

37. The data read method according to claim 36, further comprising the step of disabling output of said data from said recording medium when detection is made that said current date is incorrect.

38. A data read method in a data reader used in a data reproduction system reading out, using a data reader, data recorded in a recording medium using a data recorder, said data recorder recording into said recording medium said data, a time limit allowing output of said data using said data reader, and a recorded date of recording said data and said time limit in said recording medium, said data read method comprising the steps of:
detecting a date,
reading out said time limit and said recorded date from said recording medium, and
determining whether output of said data recorded in said recording medium is allowed or not based on said time limit and said recorded date read out, and a current date detected at said step of detecting a date,
reading out said data from said recording medium for output when output of said data is allowed, and
storing the current date detected at said step of detecting a date as a monitor date,
wherein said step of determining whether output of said data is allowed or not comprises the step of determining whether output of said data recorded in said recording medium is allowed or not based on said time limit, said recorded date, said monitor date and said current date.

39. The data read method according to claim 38, wherein said step of determining whether output of data is allowed or not comprises the step of determining that output of said data recorded in said recording medium is allowed when said current date is after said recorded date, after said monitor date and before said time limit.

40. The data read method according to claim 39, further comprising the step of detecting that said current date is incorrect when said current date is before said monitor date.

* * * * *